United States Patent [19]

Kobayashi et al.

[11] Patent Number: 4,890,057
[45] Date of Patent: Dec. 26, 1989

[54] INSTRUMENT WITH CROSSED-COIL TYPE MOVABLE MAGNET

[75] Inventors: Hisataka Kobayashi; Fujio Araki; Yoshihiro Ohtani, all of Niigata, Japan

[73] Assignee: Nippon Seiki Co., Ltd., Niigata, Japan

[21] Appl. No.: 213,101

[22] Filed: Jun. 28, 1988

[30] Foreign Application Priority Data

Aug. 31, 1987 [JP] Japan .................... 62-217323

[51] Int. Cl.⁴ .............................. G01R 5/06
[52] U.S. Cl. .................. 324/140 D; 324/166; 324/140 R; 341/131; 341/117
[58] Field of Search .............. 341/117, 131; 324/140 R, 140 D, 143, 160, 166, 163

[56] References Cited

U.S. PATENT DOCUMENTS

| | | |
|---|---|---|
| 3,636,447 | 1/1972 | Gelenius . |
| 3,976,869 | 8/1976 | Stella ................. 341/131 |
| 3,999,129 | 12/1976 | Kasson ................. 341/131 |
| 4,144,577 | 3/1979 | Ley ................. 341/131 |
| 4,160,245 | 7/1979 | Scott ................. 341/117 |
| 4,183,016 | 1/1980 | Sawagata ................. 341/131 |
| 4,230,984 | 10/1980 | Taylor . |
| 4,594,575 | 6/1986 | Avery ................. 341/131 |
| 4,725,814 | 2/1988 | Pohl ................. 341/131 |
| 4,751,496 | 6/1988 | Araki ................. 341/131 |

FOREIGN PATENT DOCUMENTS

| | | |
|---|---|---|
| 2035164 | 3/1971 | Fed. Rep. of Germany . |
| 3011013 | 10/1981 | Fed. Rep. of Germany . |
| 2508176 | 12/1982 | France . |
| 61120063 | 3/1984 | Japan . |
| 0159825 | 7/1986 | Japan ................. 341/131 |
| 0159826 | 7/1986 | Japan ................. 341/131 |

*Primary Examiner*—Reinhard J. Eisenzopf
*Assistant Examiner*—Jose M. Solis
*Attorney, Agent, or Firm*—Lowe, Price, LeBlanc, Becker & Shur

[57] ABSTRACT

An instrument with cross-coil type movable magnet which performs desired indication by A-D converting in accordance with the state of an object under measurement and applying to the crossed coils the current corresponding to a digital value after A-D conversion, comprising an A-D converter to which an input signal corresponding to the state of the object under measurement is sent after overlapping with a dithering ripple, thereby enabling improvement in the resolution of pointer indication.

6 Claims, 2 Drawing Sheets

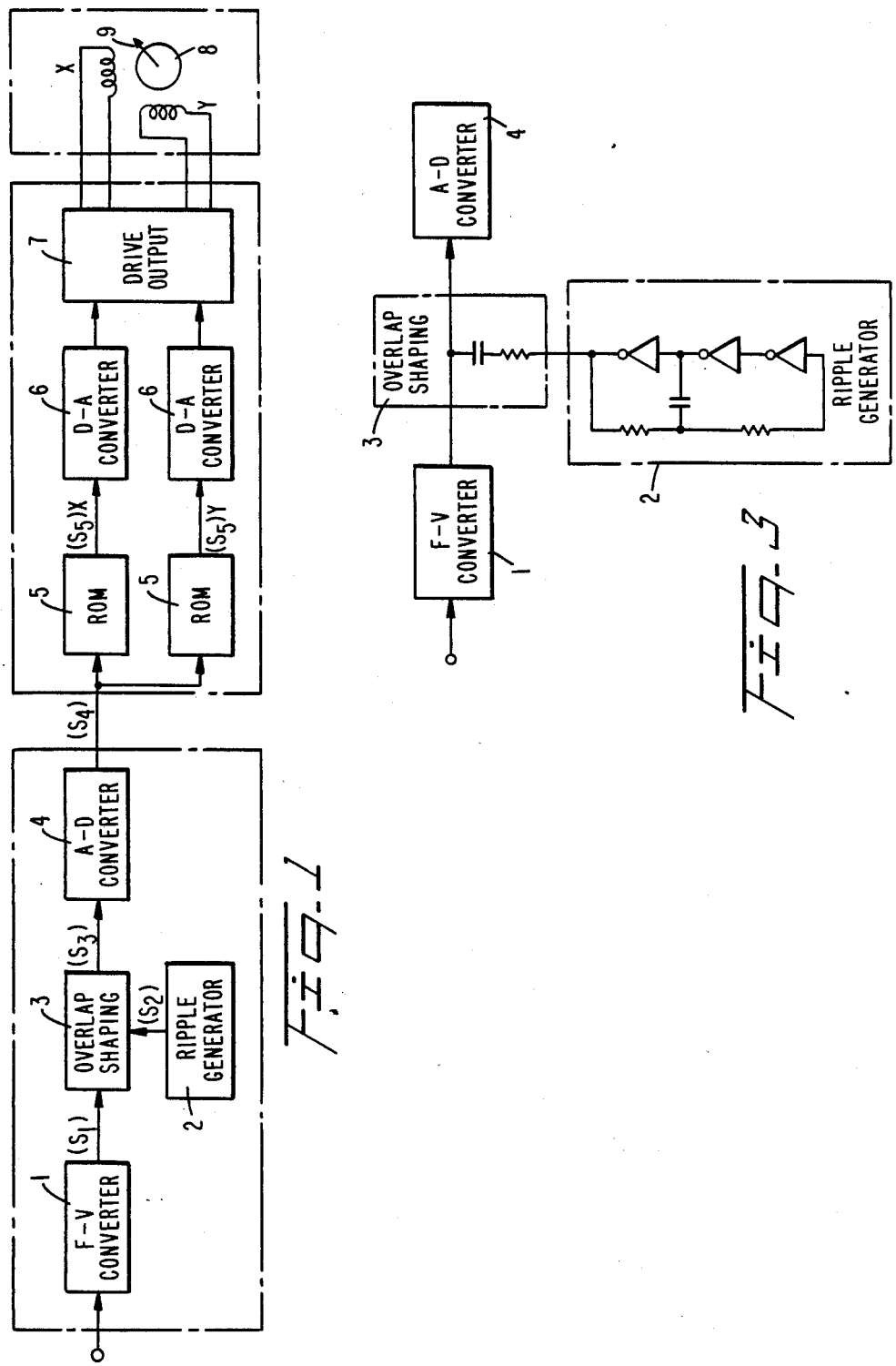

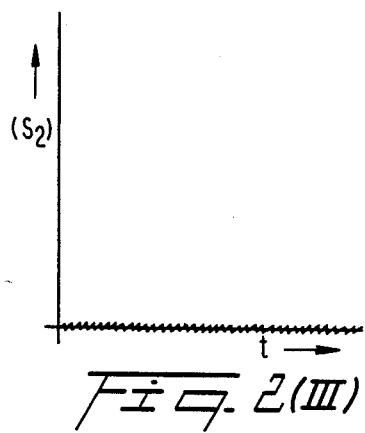
Fig. 2(III)

INSTRUMENT WITH CROSSED-COIL TYPE MOVABLE MAGNET

BACKGROUND OF THE INVENTION

1. Field of the Invention

The present invention relates to an instrument with crossed-coil type movable magnet generally used in speedometers, tachometers and other instruments for motor vehicles.

2. Description of Prior Art

An instrument with a crossed-coil type movable magnet is generally composed of an indicator section, a drive section and a converter section. The indicator section forms a body of this instrument. In this instrument a pointer shaft is projectingly installed; a movable magnet rotating on the center of the pointer shaft is installed within a bobbin; and a crossed coil is disposed intersecting perpendicularly to the bobbin. The drive section, receiving a signal from the converter section, applies a specific current to the crossed coil. And the converter section functions to convert an input from an object under measurement into an electrical signal which is easy to process in the drive section. Therefore, the specific currect is applied to the crossed coil in accordance with the amount of input from the object under measurement to develop a magnetic field in the crossed coil, which in turn rotates the movable magnet in the direction of composite magnetic field of the magnetic field. The pointer also turns with it, indicating a measured amount.

If it is possible to change the direction of energizing the crossed coil, a composite magnetic field can be established in any direction through 360 degrees. Generally, the current corresponding to a sine value of a designed pointer angle is applied to one crossed coil and the current corresponding to the cosine value to the other coil; the drive section receives the input from the aforesaid converter, outputting a corresponding value described above. (Refer to U.S. Pat. No. 3,636,447.) There is provided the converter section so that, in this case, the drive section can easily perform processing to output the aforesaid corresponding value. In general, the frequency input is converted into a voltage output and inputted into the drive section. (Refer to Laid-Open Japanese Patent Application No. Sho 61-120063.)

When the processing means in the drive section of the aforesaid instrument with crossed-coil type movable magnet is operated by a digital signal, the input from the object under measurement is converted into a specific digital signal at the converter, being supplied to the drive section, which in turn outputs correspondingly to this digital signal. The indication resolution of the instrument, therefore, is determined correspondingly to the fragmentation of digital signal (driving input) described above. The higher the resolution of pointer indication of the instrument, the smoother the pointer operates, thus resulting in improved instrument performance. Therefore, sending to the drive section a digital signal that has been further fragmented at the aforementioned converter can provide an instrument of such higher pointer indication resolution.

The fragmentation of the converter output, however, increases the processing mechanism of the drive section corresponding thereto.

SUMMARY OF THE INVENTION

The present invention has as its object the provision of an instrument with crossed-coil type movable magnet which can improve indication resolution without increasing the processing mechanism of its drive section.

The instrument with crossed-coil type movable magnet of the present invention has a built-in movable magnet which rotates on the center of a pointer shaft in the crossed coil. In this instrument comprising an indicator section which indicates an amount measured by applying the current to the crossed coil, a drive section which outputs to energize the above-mentioned crossed coil, and a converter section which changes the input signal from the object under measurement into a signal suitable for processing at the aforementioned drive section, it is characterized that converter section converts an input from the object under measurement into a voltage signal and at the same time overlaps a ripple with the aforesaid voltage signal and thereafter into a digital signal corresponding to the voltage level, then outputting the signal to the drive section.

The function of the present invention will be described below with reference to FIG. 2. When a measured amount from an object under measurement is outputted in a frequency value for example, the measured amount is once changed into a voltage signal ($S_1$) (FIG. I to FIG. II show an input from the object under measurement increasing at a given ratio with the lapse of time t, which is overlapped (FIG. 2(IV)) with a ripple ($S_2$) (FIG. 2(III)). The insert of graph IV of FIG. 2 shows the resultant summed or overlapped signal $S_3$ ($S_1 + S_2$) on an expanded scale including the generally triangular waveform of the superimposed ripple signal, $S_2$. Then, the overlapped signal ($S_3$) is converted into digital signals a, b, c and d according to its voltage levels (FIG. V). If the voltage signal ($S_2$) is converted into the digital signals without overlapping the ripple ($S_2$), the digital signal changes in the order of a→b→c→d as shown in FIG. 2(VI). After the overlapping of the ripple, however, the digital signal varies as a ($\alpha$ area)→($\beta$ area) where a and b alternately take place→b ($\gamma$ area)→($\delta$ area) where b and c alternately take place. When this is inputted into the drive section, the drive section will output a driving power corresponding to the a signal in the $\alpha$ area, a driving power corresponding to the a signal and a driving power corresponding to the b signal in the $\beta$ area, and a driving power corresponding to the b signal in the $\gamma$ area.

Therefore, at the ripple frequency held so high that no pointer vibration will occur, the pointer in the aforementioned $\alpha$, $\beta$ and $\gamma$ areas moves to read a value corresponding to the a signal, a value in an intermediate position between a value corresponding to the A signal and a value corresponding to the b signal, and a value corresponding to the b signal when the movement of the pointer is stabilized at a mean value of power supplied to the crossed coil, with the result that the resolution of pointer indication can be improved particularly without increasing the processing function of the drive section.

BRIEF DESCRIPTION OF THE DRAWINGS

The present invention will be apparent from the following detailed description taken in conjunction with the accompanying drawings in which:

FIG. 1 is a block diagram showing a preferred embodiment of the present invention;

FIG. 3 is a fragmentary view showing an embodiment of the ripple generator section and overlap shaping section in FIG. 1 stated above.

BEST MODE FOR PRACTICING THE INVENTION

Figure 2I:
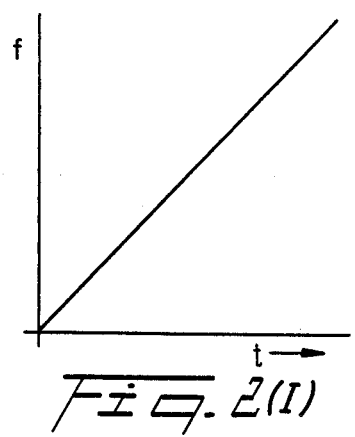
FIG. 2 is a graph showing the function of the above-mentioned embodiment.
Figure 2:
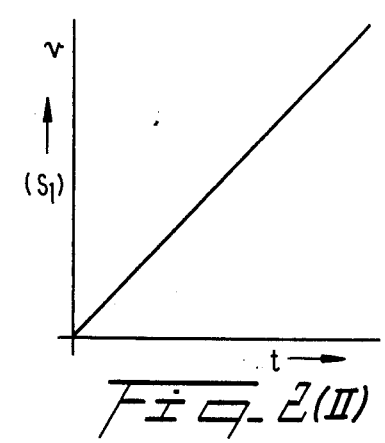
Figure 2:
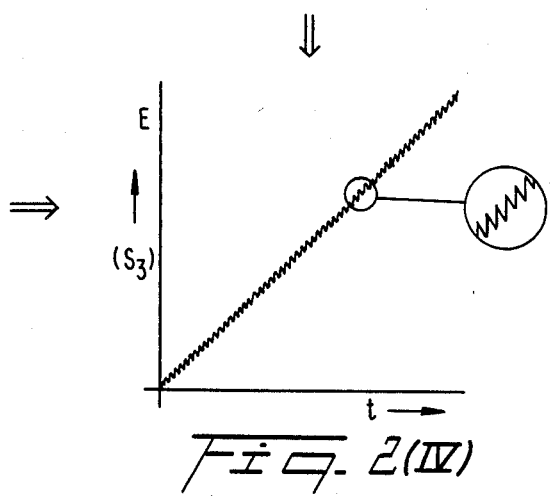
Figure 2V:
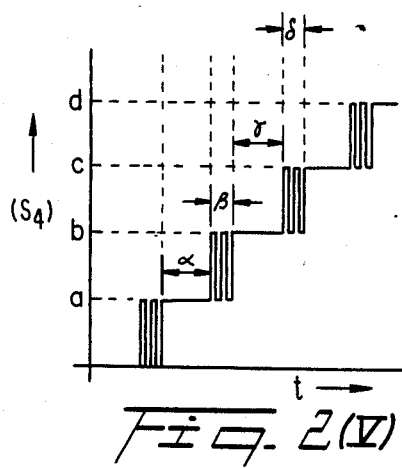
Figure 2:
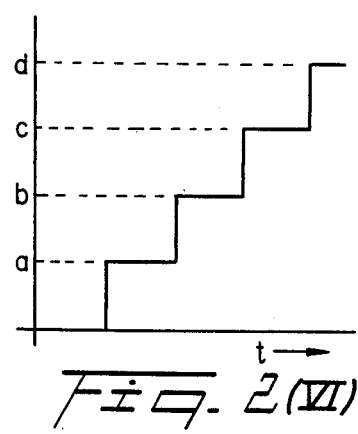

Hereinafter an exemplary embodiment of an instrument with crossed-coil type movable magnet according to the present invention will be described with reference to the accompanying drawings. FIG. 1 is a block diagram for the instrument of the present invention. The whole body of the instrument is constituted of a converter section A, a drive section B, and an indicator section C. The converter section A receives an input signal from an object under measurement and outputs a signal which will become a signal for driving the following drive section. It consists of an F-V converter section 1, a ripple generator section 2, an overlap shaping section 3 and an A-D converter section. The F-V converter 1 converts a measured amount inputted in a form of frequency from the object under measurement, into a voltage signal a. The ripple generator section 2, provided with a so-called oscillator circuit, generates a ripple voltage signal b. The overlap shaping section 3 overlaps the aforementioned voltage signal ($S_1$) with the ripple signal ($S_2$), outputting an overlapped signal ($S_3$) to the following AD converter section 4. Ripple signal ($S_2$) preferably has a generally triangular waveform as shown in FIG. 2(III). The A-D converter 4 divides the above-mentioned overlapped signal ($S_3$) according to the voltage levels, thus generating a digital signal ($S_4$) correspondingly to each level division. The drive section B consists of a ROM section 5, a D-A converter section 6, and a drive output section 7. The ROM section 5 functions to store data for indicating the quantity of electricity supplied to the crossed coils X and Y of the section C described above correspondingly to the aforementioned digital signal ($S_4$); receiving the digital signal ($S_4$), the ROM section 5 outputs digital signals ($S_5$)x and ($S_5$)y correspondingly the quantity of electricity supplied. The D-A converter 6 functions to convert the aforementioned output digital signals ($S_5$)x and ($S_5$)y to an analog quantity. The drive output section 7 energizes the crossed coils X and Y correspondingly to the aforesaid analog quantity. The indicator section C is the so-called body of the instrument. It has a movable magnet 8 built in a bobbin formed by combining a frame. On the outside surface of the frame are wound the crossed coils X and Y. The above-mentioned movable magnet is provided with an indicator shaft which is projectingly installed, and furthermore a pointer 9 is installed on the indicator shaft.

Next the operation of the above-mentioned exemplary embodiment will be explained. When an object to be measured is for example the number of revolutions of engine, a signal of a frequency proportional to the number of revolutions R of engine enters the F-V converter sectional, which in turn outputs a voltage signal ($S_1$) proportional to the input frequency. This voltage signal ($S_1$) is then overlapped with a ripple signal ($S_2$). An overlapped signal ($S_3$) is converted into a specific digital signal ($S_4$) divided at the voltage level by the A-D converter section 4, entering the ROM section 6. The ROM section 6 outputs digital signals ($S_5$)x, ($S_5$)y to each coil corresponding to the digital signal ($S_4$) inputted. In this ROM section 6, output digital signals ($S_5$)x, ($S_5$)y of numerical values corresponding to sin $\theta$ and cos $\theta$ at the time when an indication angle at for example the number of revolutions R is set at $\theta$ on the basis of the number of revolutions 0, are stored in advance within the range of 0 to the maximum value of the number of revolutions; according to the above-mentioned storage, the output digital signals ($S_5$)x, ($S_5$)y are determined. These output digital signals ($S_5$)x, ($S_5$)y are converted into analog quantities (voltage value or current value) by the D-A converter section 7. The above-described analog quantity is amplified, being supplied to the crossed coils X and Y.

The above-mentioned converter section A in operation will be described in detail. When the ripple ($S_2$) is overlapped wit the voltage signal ($S_1$) and converts the thus overlapped signal ($S_3$) into a digital signal ($S_2$) that has been divided by a specific voltage level, a fixed digital signal ($S_4$) will be generated if the amplitude of the ripple of the overlapped signal ($S_3$) is within the voltage division range at the time of A-D conversion. However, if a part of the ripple of the overlapped signal ($S_3$) is out of the voltage division range, an unfixed rippling digital signal ($S_4$) will be generated, and accordingly the current being applied to the crossed coils X and Y of the drive output section 8 also will ripple. Therefore, when the frequency of the ripple signal ($S_2$) is held at a level where no pointer vibration will occur, the pointer will come in an intermediate position (in the direction of a magnetic field formed by the mean current applied to the crossed coils) of indication corresponding to two voltage division ranges.

Therefore, the pointer indication resolution can be improved without increasing the operation processing capacity of the drive section B itself, for example the volume of memory of the ROM section. Furthermore, the ripple current, flowing into the crossed coils, serves to prevent hysteresis.

The present invention is applied to digital signal processing by the processing mechanism of the drive section of the crossed coils. The processing mechanism itself is not limited to the use of the ROM section previously described.

In this disclosure, there is shown and described only the preferred embodiment of the invention, but, as aforementioned, it is to be understood that the present invention is capable of use in various other combinations and environments and is capable of changes or modifications within the scope of the inventive concept as expressed herein.

What is claimed is:

1. A crossed-coil indicator system for displaying an analog electrical quantity, comprising:
   input means for receiving an analog electrical signal;
   ripple generator means for adding an a.c. signal having a predetermined frequency to said analog signal received at said input means to generate a ripple modulated signal;
   A-D converter means receiving said ripple modulated signal and supplying a digital output signal in response thereto;
   indicator driver means receiving said digital output signal and, in response thereto, generating first and second analog drive signals; and
   a cross-coil type indicator including a pair of orthogonally wound crossed coils receiving said first and second analog drive signals, respectively.

2. The crossed-coil indicator system of claim 1 wherein said indicator driver means includes memory means for generating digital sine and cosine signals responsive to said digital output signal, and D-A converter means for converting said digital sine and cosine signals into said first and second analog drive signal, respectively.

3. The crossed-coil indicator system of claim 1 wherein a.c. signal added by said ripple generator means has a generally triangular waveform.

4. The crossed-coil indicator system of claim 1 further comprising frequency-to-voltage converter means for receiving an input signal and in response to a frequency thereof, supplying said analog electrical signal to said input means whereby said analog electrical signal has a voltage responsive to said frequency of said input signal.

5. The crossed-coil indicator system of claim 1 wherein said ripple generator means comprises:

inverting-amplifier means having an output connected to supply said a.c. signal;
amplifier means having an output connected to an input of said inverting-amplifier means;
first resistor means having one terminal connected to an input of said amplifier means;
second resistor means having one terminal connected to said output of said inverting-amplifier means and another terminal connected to the other terminal of said first resistor means; and
capacitor means having one terminal connected to the output of said amplifier means and to the input of said inverting-amplifier means, said capacitor means having another terminal connected to the other terminals of said first and second resistor means.

6. The crossed-coil indicator system of claim 5 wherein a.c. signal added by said ripple generator means has a generally triangular waveform.

* * * * *